United States Patent
Lohwasser et al.

(10) Patent No.: US 6,277,496 B1
(45) Date of Patent: Aug. 21, 2001

(54) PACKAGING MATERIAL

(75) Inventors: Wolfgang Lohwasser, Gailingen (DE); Patrik Zeiter, Zurich (CH)

(73) Assignee: Alusuisse Technology & Management Ltd, Neuhausen am Rheinfall (*) Notice: Subject to any disclaimer, the term of this patent is extended or adjusted under 35 U.S.C. 154(b) by 0 days.

(21) Appl. No.: 09/424,304

(22) PCT Filed: May 14, 1998

(86) PCT No.: PCT/CH98/00200

§ 371 Date: Feb. 28, 2000

§ 102(e) Date: Feb. 28, 2000

(87) PCT Pub. No.: WO98/53115

PCT Pub. Date: Nov. 26, 1998

(30) Foreign Application Priority Data

May 21, 1997 (EP) ................................................ 97810313

(51) Int. Cl.⁷ ................................ B32B 15/04; B05D 1/36
(52) U.S. Cl. ..................... 428/469; 428/172; 428/207; 428/209; 428/210; 428/702; 428/916; 206/807; 427/405; 427/419.2
(58) Field of Search .................................. 428/913, 34.4, 428/34.6, 156, 213, 446, 702, 704, 172, 209, 210, 207, 469; 427/585, 405, 126.3, 250, 419.2; 283/58, 91; 206/807

(56) References Cited

U.S. PATENT DOCUMENTS 3,858,977  1/1975  Baird et al. .
4,779,898  10/1988  Berning et al. .
5,059,245  10/1991  Phillips et al. .
5,437,931  8/1995  Tsai et al. .

FOREIGN PATENT DOCUMENTS 4305856  6/1994  (DE) .
4438608  5/1995  (DE) .
7-252773  10/1995  (JP) .

OTHER PUBLICATIONS

Abstract XP002043561, Database WPI, Section Ch, Week 9548, Derwent.

Primary Examiner—Donald J. Loney
(74) Attorney, Agent, or Firm—Fisher, Christen & Sabol

(57) ABSTRACT

A form of packaging or packaging aid having integral guarantee of original pack and/or first-time opening containing a substrate with a surface that reflects visible light. The reflective surface is made of metal or is a metallic reflective surface. One or more single ceramic layers are provided on the reflecting surface. The ceramic layers are made of a compound having the formula $SiO_x$, where x represents a number from 1.5 to 2.0, each ceramic layer has a thickness of 50 to 2000 nm. The ceramic layer is directly, nonreleasably affixed to the substrate or to the reflective surface of the substrate. On the ceramic layers, a reflecting layer which is semipermeable to visible light is provided. The reflective layer is made of metal and has a thickness of 0.2 to 60 nm, and is such that light striking the coated substrate is reflected and seen as different colors depending on the direction or angle at which it is viewed by an observer.

35 Claims, 1 Drawing Sheet

PACKAGING MATERIAL

Figure 1:
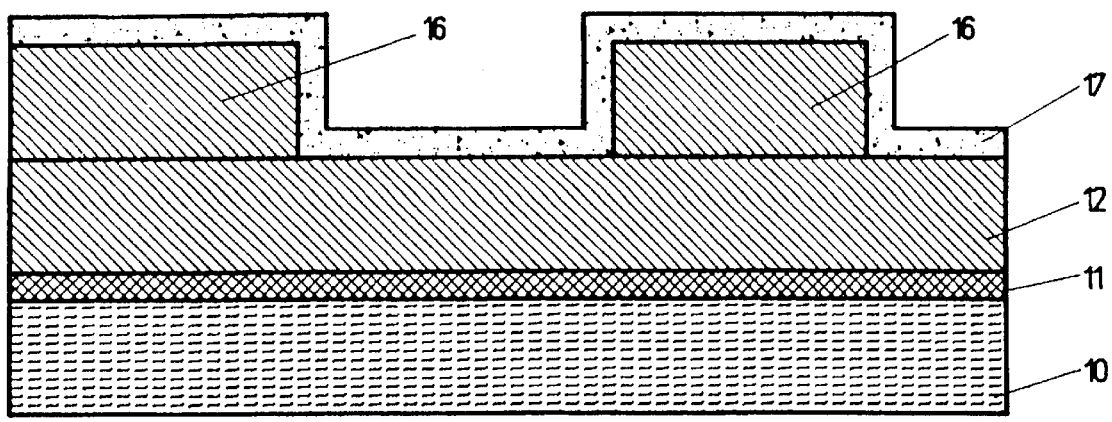

The present invention relates to forms of packaging or packaging aids having an integral guarantee of first-time opening and/or of original pack containing a substrate with a reflecting surface and a process for manufacturing such forms of packaging or packaging aids.

It is known to make forms of packaging or packaging aids secure against falsification using holograms, colour codes or invisible features. In order to be able to determine whether a package has already been opened, either with or without permission, a guarantee of first-opening is provided on the package itself This guarantee enables the customer to see if the purchased item has actually been produced and packaged by the desired manufacturer and isi not an imitation or falsification. The first-opening guarantee may e.g. be in the form of a label, stamp or sealing strip etc. which is positioned e.g. over a closure on a bottle or wide necked glass, over the seam joining the lid and a container or over the tear-off closure on a pouch. On opening the packaging in question, the label, stamp or sealing strip is broken, showing that the package has already been opened. It is also possible to transfer or enclose items on repackaging such that—by means of characteristic, unmistakable features that cannot be copied—it is clear which supplier packaged the goods in question.

In practise holograms e.g. have found use for this purpose. Examples of this are hologram labels or lidding foils with integral holograms. It is, however, extremely expensive to product, holograms. In view of the fact that forms of packaging and packaging aids are employed for short-lived products that are used only once, efforts are being made to provide forms of packaging or packaging aids that are cost-favourable to produce, but cannot be easily falsified.

That objective is achieved by way of the invention in that, provided on the reflecting surface (11) of metal or on the metallic reflecting surface (11) is a single or plurality of layers of one or more ceramic layers (12, 14, 16) containing or comprising a compound having the formula $SiO_x$, where x represents a number from 1.5 to 2.0, each layer having a thickness of 50 to 2000 nm (nanometre), and over the surface of the ceramic layer or over at least one of the surfaces of the ceramic layers, a layer (13, 15, 17) which is semi-permeable for visible light is provided, said layer being of metal and having a thickness of 0.2 to 60 nm (nanometre), and is such that light striking the coated substrate is reflected and the reflected light is seen as different colours depending on the direction or angle at which it is observed.

The integral guarantee of first-time opening and/or of origin on the packaging or packaging aid according to the present invention can always be recognised by the observer under daylight or artificial light, directly and without the assistance of any kind of apparatus. The colour or shade of colour seen by the observer depends on the direction or angle at which the package or packaging aid is viewed.

The substrate employed may e.g. be any kind of packaging material of choice. The packaging material may be rigid, semi-rigid or flexible and may be a shaped body or, in particular, a film or foil-type material. Examples of shaped bodies are blown, deep-drawn and/or stretch-drawn or deepened shaped bodies such as bottles, wide-necked containers, beakers, dishes or base parts of push-through packs. Examples of foil-type materials are metal foils of aluminium, steel, copper, silver or gold. Other examples of foil-type materials are paper such as tissue paper with a weight per unit area of 20 to 30 $g/m^2$ or highly whitened paper having a weight per unit area of 40 to 60 $g/m^2$, cardboard, semi-cardboard or the like. Important are in particular films containing plastic e.g. plastics based on polyolefins, polyethylenes or polypropylenes, polyamides, polyvinylchloride, polyesters such as polyalkylene-tterephthalates and in particular polyethylene-terephthalate. The films containing plastic may be monofilms of plastics, laminates of two or more plastic films, laminates of metal foils and plastic films, laminates of two or more plastic films, laminates of metal and plastic films, laminates of papers and plastic films or laminates of papers and metal foils and plastic films. The individual plastic films may be e.g. from 12 to 100 μm thick and the metal foils from 12 to 100μm thick. Substrates and also laminates may be e.g. of papers, semi-cardboard, cardboard and metal foils. The individual layers of foil type materials may be joined together by means of adhesives, laminating agents, bonding agents an/or by extrusion coating, co-extrusion or laminating etc.

Preferred substrates are non-oriented or singly or biaxially oriented monofilms or laminates of two or more non-oriented or singly or biaxially oriented plastic films based on polyolefins such as polyethylenes or polypropylenes, polyamides, polyvinylchloride, polyesters such as polyalkylene-terephthalates and in particular polyethylene-terephthalate. For example mono-films acting as the basic substrate may be provided with the layers according to the invention and, in subsequent processing steps, the monofilms deposited in further layers until the final substrate has been formed.

Further typical examples of substrates have the following make up:

a) a first layer containing a non-oriented, singly or biaxially oriented monofilm or a laminate of two or more non-oriented, singly or biaxially oriented films of plastics based on polyolefins such as polyethylenes or polypropylenes, polyamnides, polyvinylchloride, polyesters such as such as polyalkylene-terephthalates and in particular polyethylene-terephthalate and/or a paper such as tissue paper with a weight per unit area of 20 to 30 $gm/m^2$ or a highly whitened paper of 40 to 60 $gmn/m^2$, or a protective layer of organic coating, b) a second layer such as a metal foil and in particular aluminium foil, c) a third layer in the form of a deposited layer of hot sealing organic material; or a) a first layer, as described above, b) the second, layer as described above, c) a third layer of non-oriented, singly or biaxially oriented monofilm or a laminate of two or more non-oriented, singly or biaxially oriented films of plastics based on polyolefins, such as polyethylenes or polypropylenes, polyamides, polyvinylchloride, polyesters such as such as polyalkylene-terephthalates and in particular polyethylene-terephthalate or a cast polyethylene coating; or a) this layer omitted, b) a first layer, such as a metal foil and in particular an aluminium foil, c) a second layer containing one or more singly or biaxially oriented monofilm or a laminate of two or more non-oriented, singly or biaxially oriented films of plastics based on polyolefins, such as polyethylenes or polypropylenes, polyamides, polyvinylchloride, polyesters such as such as polyalkylene-terephthalates and in particular polyethylene-terephthalate, and/or a paper such as a tissue paper with a weight per unit area of 20 to 30 30 $g/m^2$ or highly whitened paper having a weight per unit area of 40 to 60 $g/m^2$, or a protective organic coating.

As a rule the first layer a) faces outwards from the packaging or is itself the outward facing side of the packaging. Accordingly, the reflecting surface is situated on the free surface of layer a) or the free side of layer b) represents the reflecting surface. On using available packaging material e.g. as lidding material for covering transparent containers, such as transparent base parts of blister packs or transparent beakers or the like, a reflecting surface and the series of layers according to the invention deposited thereon may be directed towards the inside of the package and be visible through the transparent base part, beaker or the like.

The substrate must exhibit the outer lying surface that reflects visible light. For that reason it is necessary for the paper, cardboard or semi-cardboard, monofilms or laminates with outer lying plastic layers to feature a reflecting surface layer. In the case of metal foils the reflecting layer can be the metal foil itself. Metal foils acting as reflecting layer can already exhibit a shiny to highly reflecting surface. If such a metal foil is not present on the substrate, or if the metal foil is embedded between other layers, or if the reflecting properties of the metal foil are inadequate, then a reflecting layer may be deposited, for example by chemical, wet chemical or physical deposition of a metal. The deposition of the metal can take place by metalization preferably by a vacuum thin film deposition process such as chemical vapour deposition (CVD) or physical vapour deposition (PVD) or by sputtering. If the substrate is a material that can be bent, then this coating may be performed continuously inn a coil treatment process.

On the reflecting surface are one or more ceramic layers in the form of a compound having the formula $SiO_x$ or containing a compound having the formula $SiO_x$, where x is a number from 1.5 to 2.0, usefully a number from 1.5 to 1.9, and preferably a number from 1.5 to 1.8. Such ceramic layers have low refractive indices, preferably with values smaller than 1.6. The ceramic layers may be obtained by methods such as vacuum thin film deposition techniques, usefully based on electron-beam vaporisation or resistance heating or inductive heating of the materials to be vaporised, known e.g. as target materials or targets. Preferred is electron-beam vaporisation. The described processes may be reactive and/or be assisted by ion beam bombardment. These processes are carried out in such a manner that the materials to be vaporised e.g. mixtures of silicon dioxide and semi-metal silicon are vaporised in vacuum in a vacuum chamber. In the vacuum chamber a ceramic layer of, or containing, compounds of the formula $SiO_x$ is deposited over the whole of the surface of the substrate and forms the ceramic layer on the side of the substrate exposed to the vaporised material. The desired value x may be arrived at e.g. by adjusting the stoichiometric ratio of $SiO_2$ to Si or $SiO_2$ to Si and other additives. The ratio of quantities of the oxygen-containing compound to semi-metal Si may in accordance with the invention represent a deficit in oxygen amounting to 10 to 30% with reference to the pure oxide in the vaporised material.

The present invention relates therefore to a process for manufacturing forms of packaging and/or packaging aids with integral guarantee of first opening and/or origin, containing Et substrate with a surface that reflects visable light. According to the process, a vacuum thin film deposition process is employed to deposit onto the reflecting surface— simultaneously in vacuum—silicon dioxide ($SiO_2$) and the semi-metal silicon (Si) as material to be vaporised, at least a 50 to 2000 nm (nanometre) thick ceramic layer comprising or containing a compound having the formula $SiO_x$, where x represents a number of 1.5 to 2.0 subsequently, a 0.2 to 60 nm (nanometre) thick reflecting layer of a metal that is semi-permeable to visible light is, deposited—for example by sputtering—on the free surface of the ceramic layer.

Further additives such as $Al_2O_3$, $B_2O_3$ and/or MgO may be added to the $Sio_2$ for vaporisation in amounts of e.g. up to 50 mol %, usefully at least 5 mol % and advantageously up to 30 mol %, in each case with reference to the amount of $SiO_2$. Further materials that may also be added for vaporisation to the $SiO_2$ are materials such as Al, B and/or Mg, in pure form or as a Si alloy, containing Al, B and/or Mg. The additions of Al, B and/or Mg may be in amounts of e.g. up to 50 mol %, usefully at least 5 mol % and advantageously up to 30 mol %, in each case with reference to the amount of Si. The quantitative ratios of the oxygen-containing, compounds such as $Sio_2$, $Al_2O_3$, $B_2O_3$ and MgO to the metals or semi-metals are selected e.g. such that in the vaporised material there is a stoichiometric deficit of oxygen amounting, to 10 to 30%—referred to the sum of pure oxides ($SiO_2$ and possibly $Al_2O_3$, $_{B_2}O_3$ and/or MgO)

The coating process is controlled via the rate of vaporisation of the material in the crucible, the deposition rate on the substrate and the duration for which the substrate is exposed to the atmosphere in the vacuum chamber, and such that a 50 nm (nanometre) to 2000 nm thick, usefully 100 to 1000 nm thick, preferably 150 to 500 nm thick layer of ceramic material is deposited. These layer thicknesses define the colour effect that can be achieved.

Over the whole or part of the surface of the first ceramic layer may be deposited a second layer or a plurality of layers of the above mentioned ceramic materials e.g. materials comprising or containing compounds having the general formula $SiO_x$, each layer having a thickness of the thicknesses given for the first ceramic layer. In the case of partial coverage, the second layer may have the form of a pattern such a logo, a character, series of lines etc. Visual effects can be created by the reflection of the incident radiation by the layers of different thickness.

A further layer of a metal of thickness 0.2 to 60 nm (nanometre), usefully 1 to 40 nm and preferably 2 to 20 nm, is provided over the ceramic layer or layers. This additional layer reflects the visible light in a semi-transparent manner and comprises or contains e.g. one or more of the following metals viz., stainless steels, Ni, Al, Cu, Ag, Au and preferably Cr. The semi-transparent layer of metal may be deposited using a further vacuum thin film deposition process, such as described above, with one of the above mentioned metals as the material to be vaporised or by sputtering with one of the above mentioned metals as the target. The target may e.g. be one of the following metals viz., stainless steel, nickel, aluminium, copper, silver, gold and preferably chromium or mixtures or alloys thereof containing or comprising the above mentioned metals. In continuous coating processes the substrate may be coated with the ceramic layer in a first chamber, then passed through a slit-type gate and into a further chamber where the semi-transparent layer of metal is deposited by sputtering.

Additionally, it is also possible to print over part of the semi-transparent reflecting layer of metal using any coloured printing material of choice. The printing may take the form of an image such as a logo, a character, patterns of lines etc. in one or more colours. In order to achieve the effectiveness of the layer system according to the invention, the printed image may be deposited only on part of the surface area.

A printed image, for characterising the packaging and packaging aid and protecting the same from falsification, may be deposited directly onto the reflecting layer of the substrate in another or additional manner. The printing may take the form of an image such as a logo, a character, patterns of lines etc. in one or more colours with the provision that the colour white is not employed. Transparent printing colours and clear organic materials are especially suitable and, as a result of the small amount of pigment or colorant, form a transparent or translucent covering. The image printed directly onto the reflecting surface using by way of preference a transparent printing material may be in one or more colour tones and the colour tones correspond especially to those colours that are created by the layer system according to the invention when observed at a particular angle. On viewing the packaging or packaging aid at the particular angle the printed image disappears as the color of the image and the color created by reflection of the light through the different layers is the same.

The reflecting layer may be also be provided with a logo, character, pattern of lines etc. by chemical means such as etching and the like. The ceramic layer then lies on the printed image or etched pattern. Before or after depositing the layers, it is also possible to emboss into the substrate a pattern such as a logo, a character, pattern of lines, this in particular when employing a metal foil substrate, i.e. for example by using embossing rolls or embossing stamps. Before or after the printing according to the invention, it is also possible, for example when the substrate in the form of a film, to stretch the substrate into the shape of a form of packaging e.g. using deep drawing or stretch drawing or a process combining deep drawing and stretch drawing. The embossing and stretching processes do not influence the colour effect, or if so then only slightly, and the colour effect is still retained.

The already mentioned processes of vacuum thin layer deposition based on electro-beam vaporisation and sputtering may be refined for the purpose of coating the substrates in question. By continuously measuring the reflection spectrum of the coated substrate, and with that the colour of the layer system on the substrate, the power of the electron beam can be raised or lowered as required until the desired layer thickness or colour is achieved. The control may be made via an automatic control system. In continuous processes the deposition rate may in some cases be controlled via the rate of advance of the substrate. The process and the choice of the described material for vaporisation or target material employed to create the layers of the mentioned ceramic materials enable e.g. high throughput rates of up to 100 m/min while coating strip shaped substrates, or coating rates of up to 200 m²/min. Particularly clear ceramic layers, free of yellowness, are obtained by appropriately choosing the material for vaporisation or target materials and creating ceramic layers of or containing the compounds having the general formula $SiO_x$, where x represents a value between 1.5 t,a 2.0. The formation of oxygen, which has to be pumped off continuously in order to maintain the vacuum, is reduced as a result of the fractions of Si, Al, B or Mg in the materials to be vaporised. This leads on the whole to high vaporisation rates.

The series of layers according to the invention may finally be covered over by a protective, outer or hot sealing layer or in particular with a transparent plastic film or laminate or plastic extrudate e.g. in order to protect it from damage due to abrasion or the likes. Typical films, laminates or extrudates for that purpose contain e.g. polyolefins such as polypropylene.

The substrate treated as described above may form the packaging or packaging aid according to the invention. For example by stamping out and sealing it is possible to manufacture e.g. pouches, sachets, wraps, bags etc. from film-shaped substrates. Using deep drawing and/or stretch drawing methods, films may be shaped into shaped packaging forms such as base parts for push-through packs or blister packs, or wide-necked containers, menu dishes goblets, beakers etc. For example tubes (laminate tubes) or lids for shaped forms of packaging may be manufactured from the films. From substrates containing e.g. carton it is possible to make boxes such as collapsible boxes. It is also possible to employ e.g. bottles from blown plastics, or pre-formed shaped packaging as substrates and to deposit the series of layers according to the invention onto them. Closures, openings, seams, seams between a base part and the related lid etc. can be provided with a packaging aid according to the invention in the form of a label, sealing strip, stamp, guarantee seal or covering seal. As a rule the latter packaging aids are in film form and are attached to the container in question. across an opening and to the surrounding part of the container e.g. by adhesive bonding, welding, flanging or shrinking etc. The packaging aid features the layer structure according to the invention that protects against falsification. This layer structure, in some cases including the additional measure of a printed or etched pattern, shows e.g. a readily recognised identification mark on the package typical of the manufacturer. The layer structure results in the desired reflection of the incident light and colour displacement of the reflected light according to the angle of viewing. Falsification by photocopying the packaging aid and use of the photocopy as a guarantee of original pack and manufacturer would be immediately and easily recognisable as the reflection and colour displacement would be missing. In order that the packaging aid, e.g. sealing strip or stamp, may be more easily broken by the consumer, it may be expedient to provide aids to tearing such as weaknesses, notches or pull-off tabs. It is also possible to employ as substrate easy-to-tear or pushthrough films, such as plastic films containing filler materials or films of two poorly compatible plastics. Other substrates are shrink films.

Figure 2:
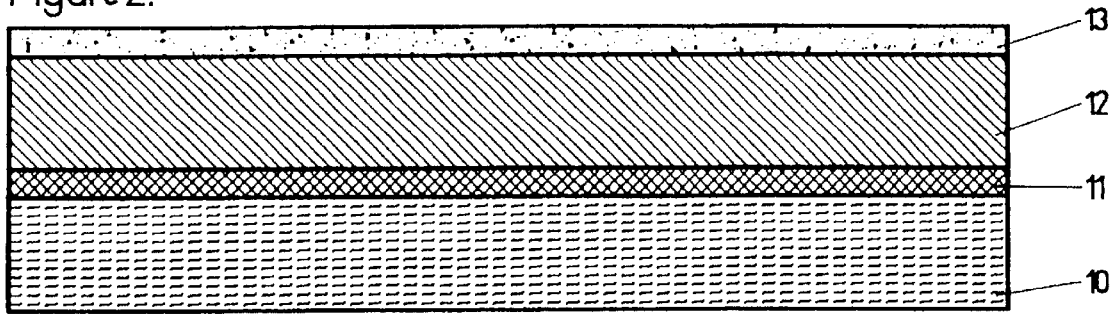
Figure 3:
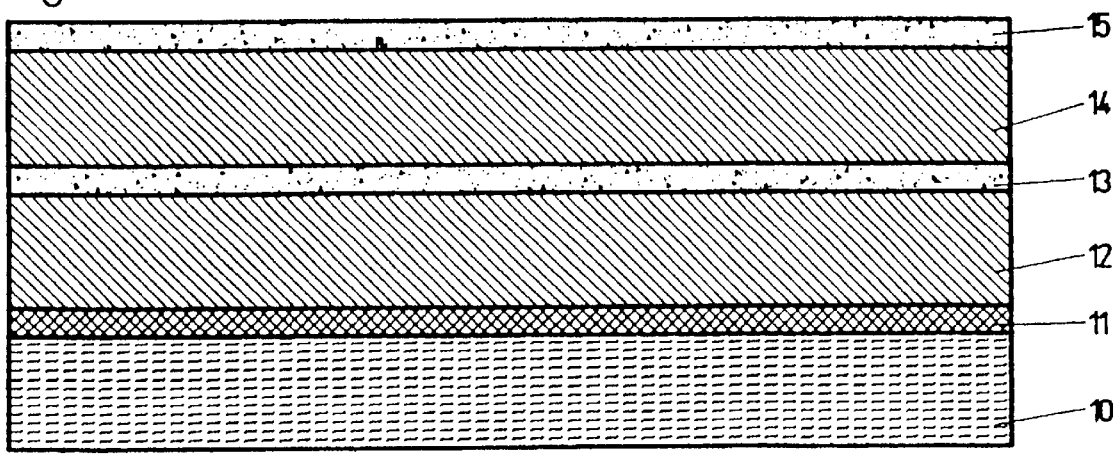

The FIGS. 1 to 3 show by way of example cross-sections through the layers of a packaging or packaging aid according to the invention.

Shown in FIG. 1 is a substrate (10) such as a laminate of plastics having a reflecting surface (11), for example covered with a layer e.g. an aluminium layer deposited by sputtering. On top of the reflecting layer (11) is the series of layers comprising two layers (12, 16) of a compound having the formula $SiO_x$, where x is a number from 1.5 to 2, each layer having a thickness in the range 50 to 2000 nm (nanometre) and, on top of the free surface of the $SiO_x$ layers (12, 16), a 0.2 to 60 nm thick reflecting layer (17) of metal which is semi-transparent to electromagnetic radiation in the visible light range. The layer (16) of a compound having the formula $SiO_x$ represents a deposit which is only partially covering in the form of a pattern such a pattern of lines. In a first process step the layer (12) is deposited over the whole of the surface and in a second step parts of the first layer (12) are masked e.g. by structured vapour deposition of oils (such as is known from the manufacture of capacitor foils) or covered by a template etc. and the second layer (16) vapour deposited onto it. On removing the covering, the layer (16) is retained as an image of the spaces between the covering and the first layer (12).

FIG. 2 shows a substrate (10), for example a laminate of plastics, a reflecting surface (11), for example a reflecting layer of e.g. aluminium produced by sputtering. Over the reflecting,s surface (11) is a series of layers comprising a 50 to 2000 nm (nanometre) thick layer (12) of a compound having the formula SiO$_x$, where x is a number from 1.5 to 2.0, and on top of the free surface of the SiO$_x$ layer a 0.2 to 60 nm (nanometre) thick reflecting layer (13) of metal, that is semi-transparent to electromagnetic radiation in the visible light range. Shown in FIG. 3 is a substrate (10), for example a laminate of plastics covered by a reflecting layer e.g. of aluminium as reflecting surface (11). On top of the reflecting surface (11) is a series of layers repeated twice each comprising a 50 to 2000 nm (nanometre) thick layer (12, 14) of a compound having the formula SiO$_x$, where x is a number from 1.5 to 2.0, and on top of the free surface of the SiO$_x$ layers a 0.2 to 60 nm (nanometre) thick reflecting layer (13, 15) of metal, that is semi-transparent to electromagnetic radiation in the visible light range.

Instead of the laminates mentioned in the examples, it is possible to employ any of the other mentioned substrates. If a substrate (10) with a reflecting surface (11) is employed, then this reflecting layer may be omitted. A coloured printed image and/or several additional layers, for example a film or extrudate of a transparent material such as polyethylene or polymers with ethyl-acrylic acid (EAA) may be deposited on the free side of the of the uppermost semi-transparent reflecting layer (13, 15, 17). A printed image may be provided directly on the reflecting surface (11) facing the layer (12), said printed image being made using a clear organic coating or in particular a transparent printing material. The reflecting surface (11) may also be characterised by way of an embossed or etched image.

What is claimed is:

1. A form of packaging or packaging aid having integral guarantee of original pack or first-time opening, or original pack and first-time opening, containing a substrate (10) with a surface (11) that reflects visible light, the reflective surface (11) is composed of metal or is a metallic reflective surface, a single Ceramic layer (12) or a plurality of ceramic layers (12, 14, 16) are provided on the reflecting surface (11), the ceramic layer (12) or ceramic layers (12, 14, 16) comprise a compound having the formula SiO$_x$, where x represents a number from 1.5 to 2.0, each ceramic layer has a thickness of 50 to 2000 nm (nanometers), the ceramic layer (12) is directly, nonreleasably affixed to the substrate (10) or to the reflective surface (11) of the substrate (10), and, on the ceramic layer (12) or the ceramic layers (12, 14, 16), a reflecting layer (13, 15, 17) which is semipermeable to visible light is provided, the layer (13, 15, 17) being of metal and having a thickness of 0.2 to 60 nm, and is such that light striking the coated substrate is reflected and seen as different colors depending on the direction or angle at which it is viewed by an observer.

2. The form of packaging or packaging aid according to claim 1 wherein, on the reflecting surface (11), is provided a plurality of layers of two or more ceramic layers (12, 16), comprising a compound having the formula Sio$_x$, where x represents a number from 1.5 to 2.0, each layer having a thickness of 50 to 2000 nm, and over the free surface of the ceramic layer (12, 16) a reflecting layer (17) which is semipermeable to visible light, is of metal and has a thickness of 0.2 to 60 nm.

3. The form of packaging or packaging aid according to claim 1, wherein over the reflecting surface (11) is provided a plurality of layers comprising a ceramic layer (12), comprising a compound having the formula SiO$_x$, where x represents a number from 1.5 to 2.0, each layer having a thickness of 50 to 2000 nm, and over the free surface of the ceramic layer (12) a reflecting layer (13) which is semipermeable to visible light, is of metal and has a thickness of 0.2 to 60 nm.

4. The form of packaging or packaging aid according to claim 1 wherein over top of the reflecting surface (11) is provided a plurality of layers repeated twice, each comprising a 50 to 2000 nm thick ceramic layer (12, 14) comprising a compound having the formula SiO$_x$ where x is a number from 1.5 to 2.0, and on top of the free surface of each of the SiO$_x$ layers is a 0.2 to 60 nm thick reflecting layer (13, 15) which is of metal and is semitransparent to electromagnetic radiation in the visible light range.

5. The form of packaging or packaging aid according to claim 1 wherein the reflecting surface (11) comprises a metal layer.

6. The form of packaging or packaging aid according to claim 5, wherein the metal layer comprises a member selected from the group consisting of Al, Cr, Ni, Au, Ag, mixtures thereof, and alloys thereof.

7. The form of packaging or packaging aid according to claim 1, wherein the substrate (10) is a single or multilayer material.

8. The form of packaging or packaging aid according to claim 7, wherein the single or multilayer material is a foil-shaped material.

9. The form of packaging or packaging aid according to claim 1, wherein the ceramic layer (12, 14, 16) is a layer that is produced in a vacuum-thin film deposition process and that is comprised of SiO$_x$.

10. The form of packaging or packaging aid according to claim 9, wherein the ceramic layer (12, 14, 16) is produced in vacuum by simultaneously vaporizing a mixture containing SiO$_2$ and Si from a vaporization source.

11. The form of packaging or packaging aid according to claim 1 wherein a first ceramic layer (12) completely covers the reflecting surface (11) and a second or a second and further ceramic layers (16) completely or partially cover the first ceramic layer, thereby creating a pattern.

12. The form of packaging or packaging aid according to claim 1, wherein the semitransparent reflecting layer (13, 15, 17) contains or comprises a metal selected from the group consisting of stainless steel, Ni, Al, Cu, Ag, Au, and Cr.

13. The form of packaging or packaging aid according to claim 12, wherein the metal is Cr.

14. The form of packaging or packaging aid according to claim 1, wherein a printed image is deposited directly onto the reflecting surface (11) in one or more color tones, one, some or all of such color tones corresponding to the colors created by the system of deposited layers according to the angle viewed by an observer, and such that when the packaging or packaging aid is viewed at a particular angle, the printed image disappears, as the color of the printed image and the color of the light reflected by the different layers are the same.

15. The form of packaging or packaging aid according to claim 14, wherein the printed image is composed of a transparent printing material.

16. The form of packaging or packaging aid according to claim 1, wherein a printed image of one or more printing colors is deposited on the free side of the semitransparent reflecting layer of metal (13, 15, 17).

17. The form of packaging or packaging aid according to claim 1, wherein the substrate is an embossed substrate.

18. The form of packaging or packaging aid according to claim 17, wherein the embossed substrate contains a metal foil.

19. A process for manufacturing a form of packaging or packaging aid with integral guarantee of original pack or first-time opening, or original pack and first-time opening, containing a substrate (10) with a reflecting surface (11) that reflects visible light, according to claim 1, comprising depositing a ceramic layer that is at least 50 to 2000 nm thick, comprising a compound having the formula $SiO_x$, where x is a number from 1.5 to 2.0, onto the reflecting surface (11) using a vacuum-thin film deposition process by simultaneously vaporizing in a vacuum silicon dioxide ($SiO_2$) and metallic silicon as material to be vaporized.

20. The process for manufacturing a form of packaging or packaging aid according to claim 18, wherein a further addition of at least one material selected from the group consisting of $Al_2O_3$, $B_2O_3$, and MgO, in an amount up to 50 mol percent, with reference to the $SiO_{21}$ is made to the material to be vaporized.

21. The process for manufacturing a form of packaging or packaging aid according to claim 20, wherein the further addition of such material is in an amount of at least 5 mol percent, with reference to the $SiO_2$.

22. The process for manufacturing a form of packaging or packaging aid according to claim 21, wherein the further addition of such material is in an amount up to 30 mol percent, with reference to the $SiO_2$.

23. The process for manufacturing a form of packaging or packaging aid according to claim 19, wherein a further addition of at least one material selected from the group consisting of Al, B, and Mg in an amount up to 50 mol percent, with reference to $SiO_2$, is made to the material to be vaporized.

24. The process for manufacturing a form of packaging or packaging aid according to claim 23, wherein the further addition of such material is in an amount of at least 5 mol percent, with reference to the $SiO_2$.

25. The process for manufacturing a form of packaging or packaging aid according to claim 24, wherein the further addition of such material is in an amount of at least 30 mol percent, with reference to the $SiO_2$.

26. The process for manufacturing a form of packaging or packaging aid according to claim 19, wherein the quantitative ratio of the oxygen-containing compound $SiO_2$ to the amount of Si stoichiometrically represents a deficit in oxygen of 10 to 30 percent, with respect to the pure oxygen in the vaporized material.

27. The process for manufacturing a form of packaging or packaging aid according to claim 20, wherein the quantitative ratio of the oxygen-containing compounds $SiO_2$, $Al_2O_3$, $B_2O_3$, and MgO to the metals or semimetals Si, Al, B, and Mg represents a stoichiometric deficit of oxygen amounting to 10 to 30 percent, with reference to the sum of pure oxides in the vaporized material.

28. The process for manufacturing a form of packaging or packaging aid according to claim 19, wherein a reflecting layer that is semipermeable to visible light is deposited on the ceramic layer or layers, the reflecting layer comprising a metal selected from the group consisting of stainless steel, nickel, aluminum, copper, gold, chromium, mixtures thereof and alloys thereof, deposited by sputtering a target comprising such metal.

29. The process for manufacturing a form of packaging or packaging aid according to claim 27, wherein such metal is chromium.

30. The process for manufacturing a form of packaging or packaging aid according to claim 19, wherein a printed image is deposited directly onto the reflecting surface in one or more color tones, and wherein one, some, or all of such color tones correspond to the colors created by the system of deposited layers according to the angle at which viewed by an observer, and such that when the packaging or packaging aid is viewed at a particular angle, the printed image disappears, as the color of the printed image and the color of the light reflected by the different layers are the same.

31. The process for manufacturing a form of packaging or packaging aid according to claim 30, wherein the printed image is composed of a transparent printing material.

32. The process for manufacturing a form of packaging or packaging aid according to claim 19, wherein the coating process is carried out continuously, and the substrate obtains the ceramic layer in a first chamber and is passed through a slit-type gate and into a further chamber where the metal layer is deposited on it by sputtering.

33. The process for manufacturing a form of packaging or packaging aid according to claim 28, wherein the coating process is carried out continuously, and the substrate obtains the ceramic layer in a first chamber and is passed through a slit-type gate and into a further chamber where the metal layer is deposited on it by sputtering.

34. The process for manufacturing a form of packaging or packaging aid according to claim 19, wherein the substrate is embossed before or after depositing the layers.

35. The process for manufacturing a form of packaging or packaging aid according to claim 34, wherein the substrate, that is embossed, is a substrate containing a metal foil.

* * * * *